(12) United States Patent
Kato et al.

(10) Patent No.: US 8,796,190 B2
(45) Date of Patent: Aug. 5, 2014

(54) THERMALLY CONDUCTIVE SILICONE GREASE COMPOSITION

(75) Inventors: Tomoko Kato, Ichihara (JP); Kazumi Nakayoshi, Sodegaura (JP)

(73) Assignee: Dow Corning Toray Company, Ltd., Chiyoda-Ku, Tokyo (JP)

( * ) Notice: Subject to any disclaimer, the term of this patent is extended or adjusted under 35 U.S.C. 154(b) by 0 days.

(21) Appl. No.: 12/865,184

(22) PCT Filed: Jan. 22, 2009

(86) PCT No.: PCT/JP2009/051399
§ 371 (c)(1),
(2), (4) Date: Nov. 2, 2010

(87) PCT Pub. No.: WO2009/096436
PCT Pub. Date: Aug. 6, 2009

(65) Prior Publication Data
US 2011/0039738 A1 Feb. 17, 2011

(30) Foreign Application Priority Data
Jan. 30, 2008 (JP) ................................. 2008-019864

(51) Int. Cl.
| C10M 125/04 | (2006.01) |
| C10M 169/04 | (2006.01) |
| C10M 141/10 | (2006.01) |
| C10M 139/04 | (2006.01) |
| C10M 105/76 | (2006.01) |

(52) U.S. Cl.
USPC ........... 508/150; 508/154; 508/161; 508/172; 508/208

(58) Field of Classification Search
USPC .......................... 508/150, 208, 154, 172, 161
See application file for complete search history.

(56) References Cited

U.S. PATENT DOCUMENTS

| 3,885,984 A | | 5/1975 | Wright | |
| 6,136,758 A | * | 10/2000 | Yamada et al. | 508/172 |
| 2002/0140082 A1 | | 10/2002 | Matayabas | |
| 2006/0100336 A1 | * | 5/2006 | Fukui | 524/430 |
| 2007/0161517 A1 | * | 7/2007 | Cheng et al. | 508/154 |

FOREIGN PATENT DOCUMENTS

| EP | 0496419 A2 | 7/1992 |
| EP | 1254924 A1 | 11/2002 |
| EP | 1352947 A1 | 10/2003 |
| JP | 50105573 A | 8/1975 |
| JP | 61157587 A | 7/1986 |
| JP | 4202496 A | 7/1992 |

OTHER PUBLICATIONS

English language abstract for JP 50105573 extracted from espacenet.com database, dated Nov. 9, 2010, 7 pages.
English language abstract for JP 61157587 extracted from espacenet.com database, dated Nov. 9, 2010, 6 pages.
English language abstract for JP 4202496 extracted from espacenet.com database, dated Nov. 9, 2010, 6 pages.
PCT International Search Report for PCT/JP2009/051399, dated Jul. 8, 2009, 4 pages.

* cited by examiner

*Primary Examiner* — Vishal Vasisth
(74) *Attorney, Agent, or Firm* — Howard & Howard Attorneys PLLC

(57) ABSTRACT

A thermally conductive silicone grease composition comprising at least the following components: an organopolysiloxane (A) represented by the following general formula: [wherein $R_1$ designates identical or different univalent hydrocarbon groups; X designates identical or different univalent hydrocarbon groups or alkoxysilyl-containing groups of the following general formula: $-R^2-SiR^1a(OR_3)_{(3-a)}$ (wherein $R^1$ designates the previously mentioned groups; $R^2$ designates oxygen atoms or alkylene groups; $R^3$ designates alkyl groups; and 'a' is an integer ranging from 0 to 2); and 'm' and 'n' are integers equal to or greater than 0, respectively]; a thermally conductive filler (B); and an organopolysiloxane (C) having silicon-bonded hydrogen atoms on both molecular terminals and in the molecular chains; is characterized by excellent resistance to heat and reduced oil bleeding.

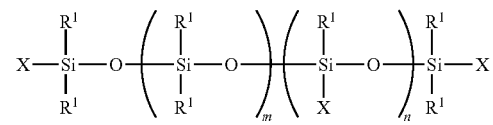

5 Claims, No Drawings

THERMALLY CONDUCTIVE SILICONE GREASE COMPOSITION

RELATED APPLICATIONS

This application claims priority to and all the advantages of International Patent Application No. PCT/JP2009/051399, filed on Jan. 22, 2009, which claims priority to Japanese Patent Application No. JP2008-019864, filed on Jan. 30, 2008.

TECHNICAL FIELD

The present invention relates to a thermally conductive silicone grease composition which is characterized by excellent resistance to heat and reduced oil bleeding.

BACKGROUND ART

In recent years, following an increase in the degree of density and integration of hybrid ICs and printed circuit boards that carry transistors, ICs, memory elements, and other electronic components, various thermally conductive silicone grease compositions comprising an organopolysiloxane and a thermally conductive filler such as an aluminum oxide powder, zinc oxide powder or the like have been used in order to achieve efficient heat transfer from such devices (see Japanese Unexamined Patent Application Publications (hereinafter referred to as "Kokai") Sho 50-105573, Sho 51-55870, and Sho 61-157587). However, a problem associated with conventional silicone grease compositions is that a part of the oil bleeds out, and this impairs reliability of the respective electronic devices.

On the other hand, in order to increase content of a thermally conductive filler in a thermally conductive silicone grease composition, it was proposed to use a thermally conductive silicone grease composition comprising an organopolysiloxane, a thermally conductive filler, and an organohydrogenpolysiloxane having in one molecule at least three silicon-bonded hydrogen atoms (see Kokai Hei 4-202496). However, such a thermally conductive silicone grease composition was subject either to oil bleeding or to dripping from thick coating layers or from vertical surfaces under the effect of heat.

It is an object of the present invention to provide a thermally conductive silicone grease composition which is characterized by excellent resistance to heat and reduced oil bleeding.

DISCLOSURE OF INVENTION

The above problems are solved by the present invention that provides a thermally conductive silicone grease composition comprising at least the following components:

100 parts by mass of an organopolysiloxane (A) represented by the following general formula:

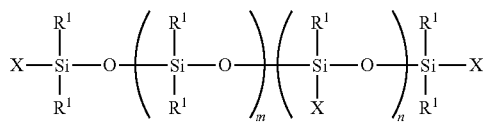

[wherein $R^1$ designates identical or different univalent hydrocarbon groups; X designates identical or different univalent hydrocarbon groups or alkoxysilyl-containing groups of the following general formula:

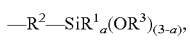

$$-R^2-SiR^1_a(OR^3)_{(3-a)},$$

(wherein $R^1$ designates the previously mentioned groups; $R^2$ designates oxygen atoms or alkylene groups; $R^3$ designates alkyl groups; and "a" is an integer ranging from 0 to 2); and "m" and "n" are integers equal to or greater than 0, respectively];

400 to 3,500 parts by mass of a thermally conductive filler (B); and 1 to 100 parts by mass of an organopolysiloxane (C) having silicon-bonded hydrogen atoms on both molecular terminals and in the molecular chains.

The aforementioned component (A) may have a viscosity ranging from 5 to 100,000 mPa·s at 25° C.

The aforementioned component (B) may have an average particle size ranging from 0.01 to 100 μm. Component (B) may comprise a metal-based powder, metal oxide-based powder, or a metal nitride-based powder. In particular, this may be a silver powder, aluminum powder, aluminum oxide powder, zinc oxide powder, or aluminum nitride powder.

Aforementioned component (C) may comprise an organopolysiloxane of the following general formula:

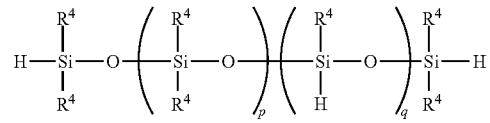

(wherein $R^4$ designates identical or different univalent hydrocarbon groups, which are free of unsaturated aliphatic bonds; "p" is an integer equal to or greater than 0; and "q" is an integer equal to or greater than 1).

The thermally conductive silicone grease composition of the invention may further contain a silica-based filler (D) in an amount of 1 to 100 parts by mass for 100 parts by mass of component (A).

The thermally conductive silicone grease composition of the invention may further contain a coupling agent (E) in an amount of 0.1 to 10 parts by mass for 100 parts by mass of component (A).

Effects of Invention

The thermally conductive silicone grease composition of the invention is characterized by excellent resistance to heat and reduced oil bleed.

DETAILED DESCRIPTION OF THE INVENTION

The organopolysiloxane of component (A) is one of the main components of the composition and is represented by the following general formula:

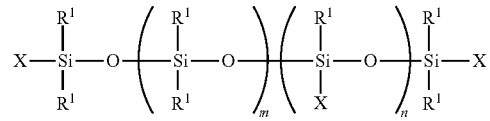

In this formula, $R^1$ may represent identical or different univalent hydrocarbon groups such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, and other linear alkyl groups; isopropyl, tertiary butyl, isobutyl, 2-methyl undecyl, 1-hexyl heptyl, and other branched alkyl groups; cyclopentyl, cyclohexyl, cyclododecyl, and other cyclic alkyl groups; vinyl, allyl, butenyl, pentenyl, hexenyl, and other alkenyl groups; phenyl, tolyl, xylyl, and other aryl groups; benzyl, phenethyl, 2-(2,4,6-trimethylphenyl) propyl, and other aralkyl groups; 3,3,3-trifluoropropyl, 3-chloropropyl, and other halogenated alkyl groups. Preferably, such groups are alkyl, alkenyl, or aryl groups, and especially preferably, methyl, vinyl, or phenyl.

In the above formula, X designates identical or different univalent hydrocarbon groups or alkoxysilyl-containing groups of the following general formula:

$$-R^2-SiR^1_a(OR^3)_{(3-a)}$$

The univalent hydrocarbon groups designated by X may be the same as aforementioned groups designated by $R^1$, of which preferable are alkyl, alkenyl, and aryl groups, especially methyl, vinyl, or phenyl groups. In the alkoxysilyl-containing groups, $R^1$ are the same as those mentioned above and preferably are alkyl groups, especially methyl groups. $R^2$ designates oxygen atoms or alkylene groups such as ethylene, propylene, butylenes, or methylethylene groups, of which preferable are ethylene and propylene groups. $R^3$ designates alkyl groups such as methyl, ethyl, propyl, or butyl groups, of which preferable are methyl and ethyl groups. In the formula, "a" is an integer ranging from 0 to 2, of which 0 is preferable.

There are no special limitations on the viscosity of component (A) at 25° C. However, the viscosity is preferably within the range from 5 to 100,000 mPa·s, more preferably, within the range from 5 to 50,000 mPa·s, and most preferably, within the range from 10 to 50,000 mPa·s. This is due to the fact that when the viscosity at 25° C. is less than the lower limit of the above-mentioned range, the physical properties of the resultant compositions tend to markedly decrease, and, on the other hand, when the viscosity exceeds the upper limit of the above-mentioned range, the handleability of the resultant compositions tends to decrease.

Specific examples of aforementioned component (A) are the following: a diorganopolysiloxane capped at both molecular terminals with trimethylsiloxy groups; a dimethylpolysiloxane capped at both molecular terminals with dimethylphenylsiloxy groups; a copolymer of a dimethylsiloxane and a methylphenylsiloxane capped at both molecular terminals with trimethylsiloxy groups; a copolymer of a dimethylsiloxane and a methylphenylsiloxane capped at both molecular terminals with dimethylphenylsiloxy groups; a methyl (3,3,3-trifluoropropyl) polysiloxane capped at both molecular terminals with trimethylsiloxy groups; a dimethylpolysiloxane capped at both molecular terminals with dimethylvinylsiloxy groups; a dimethylpolysiloxane capped at both molecular terminals with methylphenylvinylsiloxy groups; a copolymer of a dimethylsiloxane and a methylphenylsiloxane capped at both molecular terminals with dimethylvinylsiloxy groups; a copolymer of a dimethylsiloxane and a methylvinylsiloxane capped at both molecular terminals with dimethylvinylsiloxy groups; a copolymer of a dimethylsiloxane and a methylvinylsiloxane capped at both molecular terminals with trimethylsiloxy groups; a methyl (3,3,3-trifluoropropyl) polysiloxane capped at both molecular terminals with dimethylvinylsiloxy groups; a dimethylpolysiloxane capped at both molecular terminals with trimethoxysiloxy groups; a copolymer of a dimethylsiloxane and a methylphenylsiloxane capped at both molecular terminals with trimethoxysiloxy groups; a dimethylpolysiloxane capped at both molecular terminals with methyldimethoxysiloxy groups; a dimethylpolysiloxane capped at both molecular terminals with triethoxysiloxy groups; a dimethylpolysiloxane capped at both molecular terminals with trimethoxysilylethyl groups; a dimethylpolysiloxane having one molecular terminal capped with a trimethylsiloxy group and another one with a trimethoxysilylethyl group; a dimethylpolysiloxane having one molecular terminal capped with a dimethylvinylsiloxy group and another one with a trimethoxysilylethyl group; a dimethylpolysiloxane capped at both molecular terminals with methyldimethoxysilylethyl groups; a copolymer of a dimethylsiloxane and a methylphenylsiloxane capped at both molecular terminals with methyldimethoxysilylethyl groups; or combinations of two or more of the above compounds.

When component (A) is an alkoxysilyl-containing organopolysiloxane, it works as a surface-treatment agent for component (B). As a result, handleability of the obtained composition is not impaired, even though component (B) has high content.

Component (B) is a thermally conductive filler used for imparting heat-conductive properties to the composition of the invention. This component can be exemplified by a metal powder based on the use of gold, silver, copper, aluminum, nickel, brass, shape-memory alloy, solder, or the like; powdered ceramic, glass, quartz, organic resin, or the like surface coated with gold, silver, nickel, copper, or a similar metal applied by a vapor deposition or a metal plating method; aluminum oxide, magnesium oxide, beryllium oxide, chromium oxide, zinc oxide, titanium oxide, crystalline silica, or similar metal oxide powders; boron nitride, silicon nitride, aluminum nitride, or a similar powdered metal nitride; boron carbide, titanium carbide, silicon carbide, or a similar powdered metal carbide; aluminum hydroxide, magnesium hydroxide, or a similar metal hydroxide; carbon nanotubes, carbon microfibers, diamond, graphite, or similar carbon-based powders; or combinations of two or more of the above substances. Most preferable for component (B) are metal powders, metal oxide powders, or metal nitride powders, in particular, silver powder, aluminum powder, aluminum oxide powder, zinc oxide powder, or aluminum nitride powder. When it is required that the composition have electrical insulating properties, it is recommended to use metal oxide powders or metal nitride powders, in particular an aluminum oxide powder, zinc oxide powder, or an aluminum nitride powder.

There are no special restrictions with regard to the shape of particles of component (B) which may be spherical, needle-shaped, disk-shaped, rod-like, or irregular in shape. There are no limitations also concerning the average particle size of component (B), which is preferably in the range from 0.01 to 100 µm and, more preferably, in the range from 0.01 to 50 µm.

In the present composition, the content of component (B) should be in the range of 400 to 3,500 parts by mass and, most preferably, 400 to 3,000 parts by mass for 100 parts by mass of component (A). This is due to the fact that when the content of Component (B) is less than the lower limit of the above-mentioned range, the thermal conductivity of the resultant compositions tends to be insufficient, and, on the other hand, when it exceeds the upper limit of the above-mentioned range, the viscosity of the resultant compositions becomes too high and it will impair handleability of the composition.

The organopolysiloxane of component (C) is used for suppressing oil bleeding from the composition. This organopolysiloxane has silicon-bonded hydrogen atoms at molecular terminals and in the chains. Other silicon-bonded groups contained in component (C) may comprise univalent hydrocarbon groups which are free of unsaturated aliphatic groups. Examples of these groups are the following: methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, and other linear alkyl groups; isopropyl, tertiary butyl, isobutyl, 2-methyl undecyl, 1-hexyl heptyl, and other branched alkyl groups; cyclopentyl, cyclohexyl, cyclododecyl, and other cyclic alkyl groups; phenyl, tolyl, xylyl, and other aryl groups; benzyl, phenethyl, 2-(2,4,6-trimethylphenyl) propyl, and other aralkyl groups; 3,3,3-trifluoropropyl, 3-chloropropyl, and other halogenated alkyl groups. Preferably, such groups are alkyl or aryl groups, and especially preferably, methyl or phenyl.

There are no special limitations on the viscosity of component (C) at 25° C. However, the viscosity is preferably within the range from 1 to 10,000 mPa·s, more preferably, within the range from 1 to 1,000 mPa·s, and most preferably, within the range from 5 to 1,000 mPa·s. This is due to the fact that when the viscosity at 25° C. is less than the lower limit of the above-mentioned range, the physical properties of the resultant compositions tend to markedly decrease, and, on the other hand, when the viscosity exceeds the upper limit of the above-mentioned range, the handleability of the resultant compositions tends to decrease.

If component (C) has silicon-bonded hydrogen atoms at molecular terminals and in the chains, no restrictions exist with regard to the molecular structure of this component which may be a linear, partially-branched linear, or a branched molecular structure. The linear molecular structure is preferable. Component (C) is represented by the following general formula:

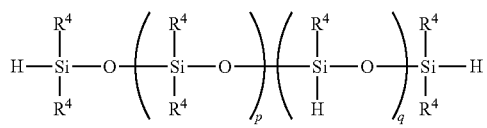

In this formula, $R^4$ designates identical or different univalent hydrocarbon groups, which are free of unsaturated aliphatic bonds; "p" is an integer equal to or greater than 0; and "q" is an integer equal to or greater than 1.

Component (C) can be exemplified by a methylhydrogenpolysiloxane capped at both molecular terminals with dimethylhydrogensiloxy groups, a copolymer of a dimethylsiloxane and a methylhydrogensiloxane capped at both molecular terminals with dimethylhydrogensiloxy groups, a copolymer of a methylphenylsiloxane and a methylhydrogensiloxane capped at both molecular terminals with dimethylhydrogensiloxy groups, and a copolymer of a dimethylsiloxane, a methylphenylsiloxane, and a methylhydrogensiloxane capped at both molecular terminals with dimethylhydrogensiloxy groups.

In the present composition, the content of component (C) should be in the range of 1 to 100 parts by mass, preferably 1 to 90 parts by mass, and most preferably 1 to 85 parts by mass for 100 parts by mass of component (A). This is due to the fact that when the content of component (C) is less than the lower limit of the above-mentioned range, the resultant compositions will be subject to oil bleeding, and, on the other hand, when it exceeds the upper limit of the above-mentioned range, this will impair heat-resistant properties of the composition.

The composition may contain an arbitrary component in the form of a silica-based filler (D) which may comprise fumed silica, fused silica, precipitated silica, or the aforementioned silicas which have been surface treated with an organic silicon compound such as an organoalkoxysilane, organochlorosilane, organosilazane, or the like.

In the present composition, there are no limitations concerning the content of component (D), but preferably it should be in the range of 1 to 100 parts by mass and, most preferably, 1 to 50 parts by mass, and most preferably, 1 to 20 parts by mass for 100 parts by mass of component (A).

If necessary, the composition may also contain another arbitrary component in the form of a coupling agent (E) that can be exemplified by methyltrimethoxysilane, butyltrimethoxysilane, hexyltrimethoxysilane, octyltrimethoxysilane, 3-aminopropyltrimethoxysilane, N-(2-aminoethyl)-3-aminopropyltrimethoxysilane, 3-glycidoxypropyltrimethoxysilane, 2-(3,4-epoxycyclohexyl)ethyltrimethoxysilane, 3-methacryloxypropyltrimethoxysilane, 3-mercaptopropyltrimethoxysilane, or a similar silane coupling agent; tetrabutyltitanate, tetraisopropyltitanate, or a similar titanate coupling agent.

Although there are no special restrictions with regard to the content of component (E), it may be recommended to add this component in an amount of 0.1 to 10 parts by mass, preferably 0.1 to 5 parts by mass for 100 parts by mass of component (A).

Within the limits not contradicting with the objects of the invention, the composition may contain other arbitrary components such as carbon black, red iron oxide, or similar pigments, as well as dyes, fluorescent dyes, heat-resistant agents, flame retarders, plasticizer, or adhesion promoters.

There are no special restrictions with regard to the method used for the preparation of the composition. For examples, the following methods are possible: component (C) can be added to a preliminarily prepared mixture of components (A) and (B); components (A), (B), and (C) are mixed simultaneously; component (C) can be added to a preliminarily prepared mixture of components (A), (B), and (E); or component (C) can be added to a preliminarily prepared mixture of components (A), (B), and (D). It is recommended to mix components (A) and (B) under heating conditions, in particular, with heating at 100 to 200° C. under a reduced pressure. When component (A) is an alkoxysilane-containing organopolysiloxane, in order to accelerate surface coating of component (B), the process is carried out either under heating conditions or with an addition of a catalytic quantity of acidic substances such as acetic acid, phosphoric acid, or the like, or with an addition of catalytic quantities of basic substances such as trialkylamine, tertiary ammonium salt, ammonia gas, ammonium carbonate, or the like.

EXAMPLES

The thermally conductive silicone grease composition of the present invention will be now explained in more details by referring to Practical Examples. Additionally, it should be noted that the physical characteristics described in the Practical Examples are represented by values obtained at 25° C.

[Viscosity]

Viscosity of the thermally conductive silicone grease composition was measured by using the rheometer AR550 of TA Instruments, Ltd., having geometry defined by a 20 mm diameter plate. Viscosity was measured at the shear rate of 10 (1/s).

[Oil Bleeding Characteristics]

The thermally conductive silicone grease composition was applied in an amount of about 0.2 cm³ onto a frosted surface of a square (5 cm side) glass plate frosted one side (the product of Paltec Co., Ltd.), the coating was covered by a square (1.8 cm side) cover glass (the product of Matsunami Glass Co., Ltd.), and by using a micrometer (the product of Mitsutoyo Co., Ltd.), the thickness of the coating was adjusted to 300 μm. The obtained specimen was held for 3 days at 25° C., and then the oil-bleed characteristics of the composition were evaluated as a ratio of a diameter of an oil spot bled out from the thermally conductive silicone grease composition to the initial diameter of the area occupied by thermally conductive silicone grease composition.

[Thermal Conductivity]

0.6 cm³ of the thermally conductive silicone grease composition was sandwiched between a copper-made test panel having dimensions of 25×75×1 mm (the product of Paltec Co., Ltd.) and a cover glass having dimensions of 25×75×1 mm (the product of Matsunami Glass Co., Ltd.), and the thickness of the composition layer was adjusted to 1 mm by spacers. The obtained specimen was arranged vertically and subjected to a heat-shock test under the following conditions:

minus −40° C./+125° C./500 cycles. Thermal conductivity was evaluated by observing the presence or absence of the composition drips.

[Thermal Conductivity]

Thermal conductivity of the thermally conductive silicone grease composition was determined as thermal resistance of the composition measured by means of a resin thermal resistance tester of Hitachi Seisakusho Co., Ltd. at 50° C. using a layer of the composition having a 1 cm×1 cm area and thickness of 200 μm and 500 μm.

Practical Example 1

100 parts by mass of a dimethylpolysiloxane represented by the following general formula:

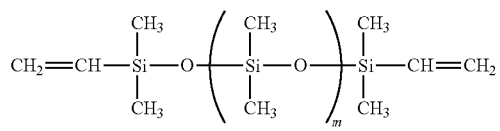

(wherein "m" is a value that occurs at viscosity of 2,000 mPa·s) and 2,360 parts by mass of a spherical aluminum oxide powder having an average particle diameter of 12 μm were premixed for 30 min. at room temperature and then mixed for another 60 min. under a reduced pressure and at a temperature of 150° C. Following this, the product was cooled to room temperature and mixed with 80 parts by mass of a copolymer of a methylhydrogensiloxane and a dimethylsiloxane having viscosity of 10 mPa·s and represented by the following formula:

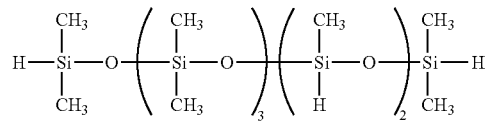

whereby a thermally conductive silicone grease composition was obtained.

Practical Example 2

100 parts by mass of a dimethylpolysiloxane represented by the following general formula:

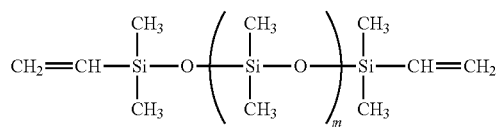

(wherein "m" is a value that occurs at viscosity of 10,000 mPa·s), 1,240 parts by mass of a spherical aluminum oxide powder having an average particle diameter of 12 μm, and 70 parts by mass an irregular-shaped zinc oxide powder having an average particle size of 0.1 μm were premixed for 30 min. at room temperature and then mixed for another 60 min. under a reduced pressure and at a temperature of 150° C. Following this, the product was cooled to room temperature and mixed with 14 parts by mass of a copolymer of a methylhydrogensiloxane and a dimethylsiloxane having viscosity of 10 mPa·s and represented by the following formula:

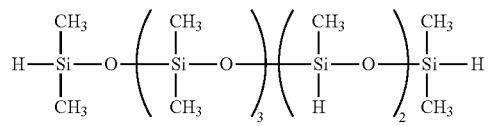

whereby a thermally conductive silicone grease composition was obtained.

Practical Example 3

100 parts by mass of a dimethylpolysiloxane represented by the following general formula:

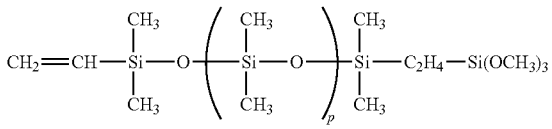

(wherein "p" is a value that occurs at viscosity of 20 mPa·s), 2,560 parts by mass of a spherical aluminum oxide powder having an average particle diameter of 12 μm, 360 parts by mass of an irregular-shaped zinc oxide powder having an average particle size of 0.1 μm, and 7 parts by mass of a methyltrimethoxysilane were premixed for 30 min. at room temperature and then mixed for another 60 min. under a reduced pressure and at a temperature of 150° C. Following this, the product was cooled to room temperature and mixed with 2.7 parts by mass of a copolymer of a methylhydrogensiloxane and a dimethylsiloxane having viscosity of 10 mPa·s and represented by the following formula:

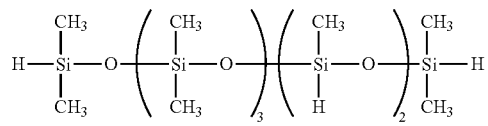

whereby a thermally conductive silicone grease composition was obtained.

Practical Example 4

100 parts by mass of a dimethylpolysiloxane represented by the following general formula:

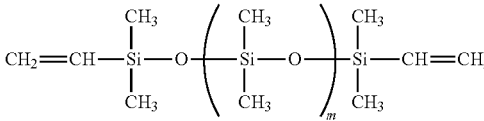

(wherein "m" is a value that occurs at viscosity of 900 mPa·s), 500 parts by mass of a spherical aluminum oxide powder having an average particle diameter of 12 μm, and 10 parts by mass of a fumed silica having BET specific surface area of 200 m²/g and hydrophobically surface-treated with a hexamethyldisilazane were premixed for 30 min. at room temperature and then mixed for another 60 min. under a reduced pressure and at a temperature of 150° C. Following this, the product was cooled to room temperature and mixed with 5 parts by mass of a copolymer of a methylhydrogensiloxane and a dimethylsiloxane having viscosity of 10 mPa·s and represented by the following formula:

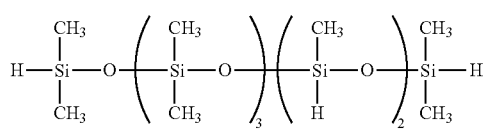

whereby a thermally conductive silicone grease composition was obtained.

Practical Example 5

100 parts by mass of a dimethylpolysiloxane represented by the following general formula:

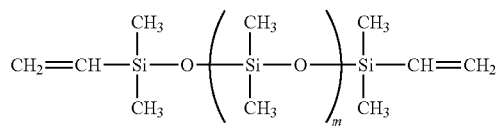

(wherein "m" is a value that occurs at viscosity of 2,000 mPa·s), 650 parts by mass of an irregular aluminum nitride powder having an average particle diameter of 3 μm, 5 parts by mass of a dimethylpolysiloxane represented by the following formula:

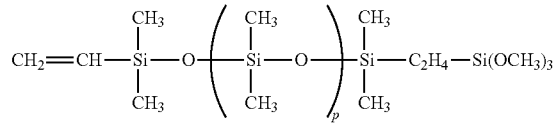

(wherein "p" is a value that occurs at viscosity of 20 mPa·s), and 5 parts by mass of a methyltrimethoxysilane were premixed for 30 min. at room temperature and then mixed for another 60 min. under a reduced pressure and at a temperature of 150° C. Following this, the product was cooled to room temperature and mixed with 10 parts by mass of a copolymer of a methylhydrogensiloxane and a dimethylsiloxane having viscosity of 10 mPa·s and represented by the following formula:

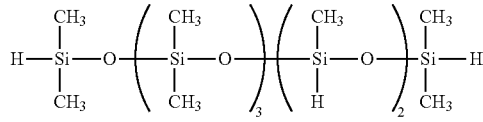

whereby a thermally conductive silicone grease composition was obtained.

Practical Example 6

100 parts by mass of a dimethylpolysiloxane represented by the following general formula:

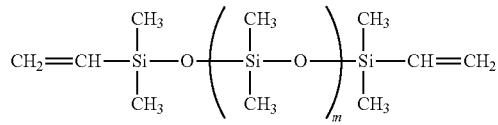

(wherein "m" is a value that occurs at viscosity of 2,000 mPa·s), 1,250 parts by mass of a spherical aluminum oxide powder having an average particle diameter of 12 μm, and 3 parts by mass of a dimethylpolysiloxane represented by the following formula:

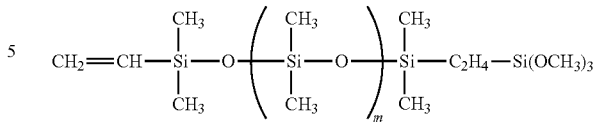

(wherein "p" is a value that occurs at viscosity of 20 mPa·s), and 3 parts by mass of a dimethylpolysilane were premixed for 30 min. at room temperature and then mixed for another 60 min. under a reduced pressure and at a temperature of 150° C. Following this, the product was cooled to room temperature and mixed with 7 parts by mass of a copolymer of a methylhydrogensiloxane and a dimethylsiloxane having viscosity of 10 mPa·s and represented by the following formula:

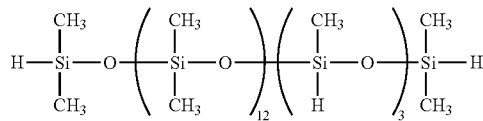

whereby a thermally conductive silicone grease composition was obtained.

Comparative Example 1

100 parts by mass of a dimethylpolysiloxane represented by the following general formula:

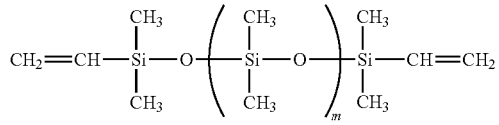

(wherein "m" is a value that occurs at viscosity of 2,000 mPa·s), 1,740 parts by mass of a spherical aluminum oxide powder having an average particle diameter of 12 μm, and 4 parts by mass of a methyltrimethoxysilane were premixed for 30 min. at room temperature and then mixed for another 60 min. under a reduced pressure and at a temperature of 150° C. Following this, the product was cooled to room temperature and mixed with 38 parts by mass of a dimethylsiloxane having viscosity of 10 mPa·s and represented by the following formula:

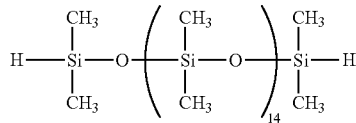

whereby a thermally conductive silicone grease composition was obtained.

Comparative Example 2

100 parts by mass of a dimethylpolysiloxane represented by the following general formula:

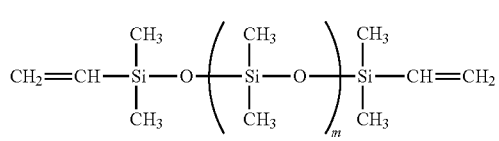

(wherein "m" is a value that occurs at viscosity of 2,000 mPa·s) and 1,850 parts by mass of a spherical aluminum oxide powder having an average particle diameter of 12 µm were premixed for 30 min. at room temperature and then mixed for another 60 min. under a reduced pressure and at a temperature of 150° C. Following this, the product was cooled to room temperature and mixed with 40 parts by mass of a copolymer of a methylhydrogensiloxane and a dimethylsiloxane having viscosity of 60 mPa·s and represented by the following formula:

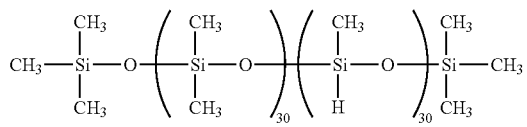

whereby a thermally conductive silicone grease composition was obtained.

Comparative Example 3

100 parts by mass of a dimethylpolysiloxane represented by the following general formula:

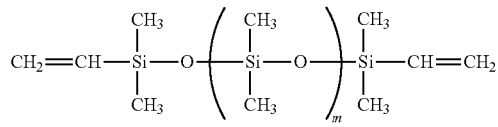

(wherein "m" is a value that occurs at viscosity of 10,000 mPa·s) and 550 parts by mass of a spherical aluminum oxide powder having an average particle diameter of 12 µm were premixed for 30 min. at room temperature and then mixed for another 60 min. under a reduced pressure and at a temperature of 150° C. whereby a thermally conductive silicone grease composition was obtained.

heat and reduced oil bleeding, this composition is suitable for use as a heat-removing medium in electrical and electronic devices.

The invention claimed is:

1. A thermally conductive silicone grease composition comprising at least the following components:
    100 parts by mass of (A) a dimethylpolysiloxane capped at both terminals with dimethylvinylsiloxy groups or a copolymer of a dimethylsiloxane and a methylphenylsiloxane capped at both molecular terminals with dimethylvinylsiloxy groups and having a viscosity in the range of 10 to 50,000 mPa·s at 25° C.;
    400 to 3,500 parts by mass of spherical aluminum oxide (B); and
    1 to 100 parts by mass of an organopolysiloxane (C) having silicon-bonded hydrogen atoms at both molecular terminals and in the molecular chains and having a viscosity in the range of 10 to 50,000 mPa·s at 25° C.

2. The thermally conductive silicone grease composition according to claim 1, wherein component (B) has an average particle size ranging from 0.01 to 100 µm.

3. The thermally conductive silicone grease composition according to claim 1, wherein component (C) is an organopolysiloxane of the following general formula:

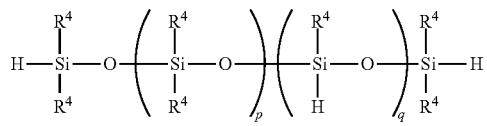

(wherein $R^4$ designates identical or different univalent hydrocarbon groups, which are free of unsaturated aliphatic bonds; "p" is an integer equal to or greater than 0; and "q" is an integer equal to or greater than 1).

4. The thermally conductive silicone grease composition according to claim 1, further containing a silica-based filler (D) in an amount of 1 to 100 parts by mass for 100 parts by mass of component (A).

TABLE 1

| | Examples | | | | | | | | |
| --- | --- | --- | --- | --- | --- | --- | --- | --- | --- |
| | Practical Examples | | | | | | Comparative Examples | | |
| Properties | 1 | 2 | 3 | 4 | 5 | 6 | 1 | 2 | 3 |
| Viscosity (Pa · s) | 210 | 750 | 800 | 550 | 380 | 600 | 450 | 450 | 720 |
| Oil bleeding properties | 1.1 | 1.0 | 1.0 | 1.0 | 1.1 | 1.0 | 2.2 | 1.8 | 1.5 |
| Resistance to heat | Did not change | | | | | | Drips | | Did not change |
| Coefficient of thermal conductivity (W/mK) | 4.5 | 4.2 | 8.5 | 1.2 | 1.6 | 4.5 | 4.5 | 4.5 | 1.6 |

INDUSTRIAL APPLICABILITY

Since the thermally conductive silicone grease composition of the invention is characterized by excellent resistance to 5. The thermally conductive silicone grease composition according to claim 1, further containing a coupling agent (E) in an amount of 0.1 to 10 parts by mass for 100 parts by mass of component (A).

* * * * *